(12) United States Patent
Lin (10) Patent No.: US 11,258,436 B1
(45) Date of Patent: Feb. 22, 2022

(54) SELF-CALIBRATING QUADRATURE CLOCK GENERATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/226,189

(22) Filed: Apr. 9, 2021

(51) Int. Cl.
| H03K 3/023 | (2006.01) |
| H03K 5/01 | (2006.01) |
| H03K 19/21 | (2006.01) |
| H03K 5/00 | (2006.01) |

(52) U.S. Cl.
CPC .............. *H03K 5/01* (2013.01); *H03K 19/21* (2013.01); *H03K 2005/00019* (2013.01)

(58) Field of Classification Search
CPC . H03K 5/01; H03K 19/21; H03K 2005/00019
USPC ....................................................... 327/270
See application file for complete search history.

(56) References Cited

U.S. PATENT DOCUMENTS

| | | | | |
|---|---|---|---|---|
| 6,560,449 B1* | 5/2003 | Liu | ..................... | H04L 27/0014 455/205 |
| 6,768,364 B2* | 7/2004 | Wang | ..................... | H03H 7/21 327/254 |
| 7,397,317 B2* | 7/2008 | Park | ..................... | H03B 27/00 331/137 |
| 10,444,785 B2* | 10/2019 | Abramzon | ..................... | G06F 1/06 |
| 10,469,061 B1* | 11/2019 | Lin | ..................... | H03K 5/1506 |
| 10,523,220 B1* | 12/2019 | Ru | ..................... | H03L 7/095 |
| 10,963,002 B1* | 3/2021 | Hafizi | ..................... | H03H 11/22 |
| 11,183,993 B2* | 11/2021 | Shin | ..................... | G06F 1/06 |
| 2003/0117201 A1* | 6/2003 | Wang | ..................... | H03B 27/00 327/254 |
| 2009/0003482 A1* | 1/2009 | Wilhite | ..................... | H03H 17/08 375/261 |
| 2014/0086364 A1* | 3/2014 | Schell | ..................... | H03H 7/21 375/340 |
| 2015/0070066 A1* | 3/2015 | Dedic | ..................... | H01L 28/10 327/254 |

* cited by examiner

*Primary Examiner* — Ryan Jager
(74) *Attorney, Agent, or Firm* — McClure, Qualey & Rodack, LLP (57) ABSTRACT

A quadrature clock generator includes a variable delay clock generator configured to receive a first clock and a third clock and output a second clock and a fourth clock in accordance with a control signal, wherein the first clock and the third clock are substantially the same but offset in timing by one half of the period; a quadrature phase error detector configured to receive the first clock, the second clock, the third clock, and the fourth clock and output a first phase detection signal and a second phase detection signal, wherein the first phase detection signal represents a relative timing between the first clock and the second clock and the second phase detection signal represents a relative timing between the second clock and the third clock; and an amplifier configured to amplify a difference between the first phase detection signal and the second phase detection signal into the control signal.

20 Claims, 5 Drawing Sheets

SELF-CALIBRATING QUADRATURE CLOCK GENERATOR AND METHOD THEREOF

BACKGROUND OF THE DISCLOSURE

Field of the Disclosure

The present disclosure generally relates to quadrature clock generation, and more particularly to a self-calibrating quadrature clock generator that generates accurately-spaced phases of the quadrature clock.

Description of Related Art

Figure 1:
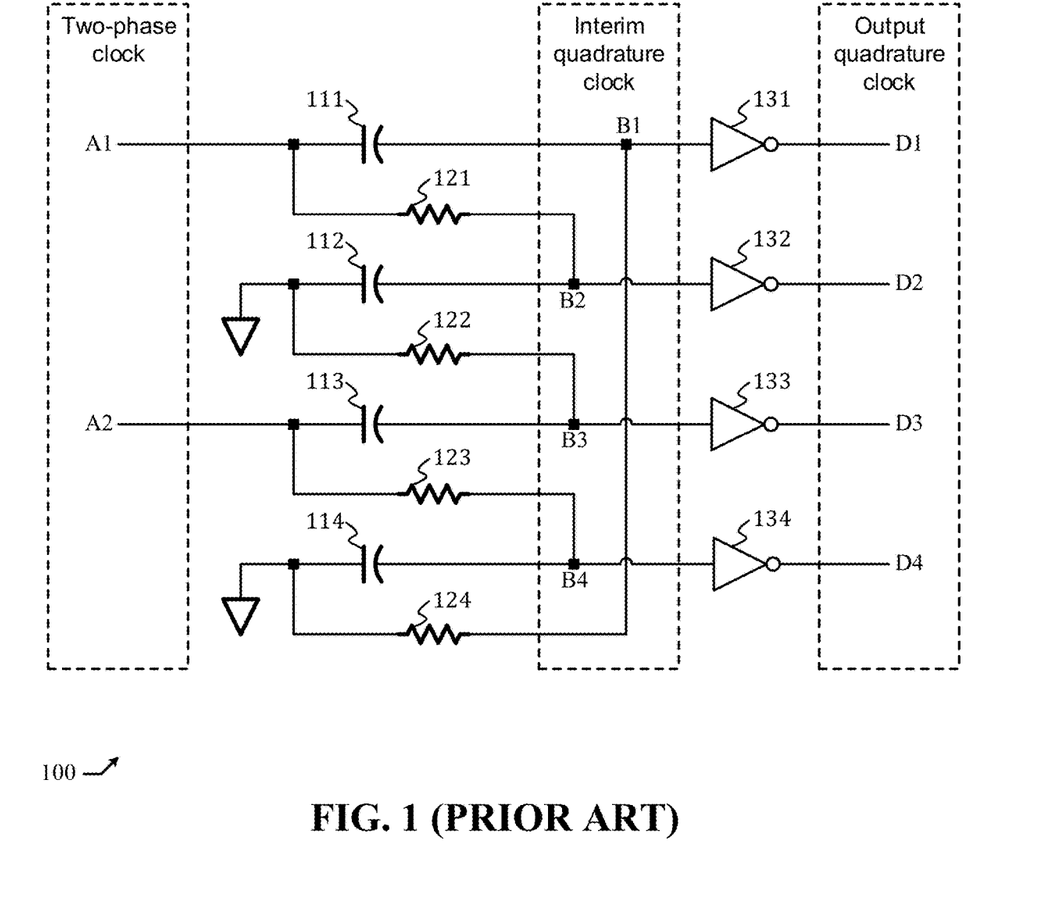
FIG. 1 shows a schematic diagram of a conventional poly-phase circuit.

As is well understood by persons skilled in the art, a clock is a voltage signal that periodically toggles back and forth between a low level and a high level. A two-phase clock is a clock having two phases that are 180 degrees out of phase. A quadrature clock is a clock having four phases, including a first phase, a second phase, a third phase, and a fourth phase, that are nominally uniformly spaced in time; that is: the first, the second, and the third phases are ahead of the second, the third, and the fourth phases by 90-degrees, respectively. A conventional polyphase filter 100 is shown in FIG. 1, which can be used to generate a quadrature clock from a two-phase clock. As shown, A1 and A2 are two phases of a two-phase clock; B1, B2, B3, B4 are four phases of an interim quadrature clock; and D1, D2, D3, and D4 are four phases of an output quadrature clock. Polyphase filter 100 includes four capacitors 111, 112, 113, and 114, four resistors 121, 122, 123, and 124; and four inverters 131, 132, 133, and 134. Capacitor 111 and resistor 124 form a first high-pass filter to filter A1 into B1. Resistor 121 and capacitor 112 form a first low-pass filter to filter A1 into B2. Capacitor 113 and resistor 122 form a second high-pass filter to filter A2 into B3. Resistor 123 and capacitor 114 form a second low-pass filter to filter A2 into B4. Inverters 131, 132, 133, 134 are used as a buffer and configured to receive B1, B2, B3, and B4 and output D1, D2, D3, and D4, respectively.

A polyphase filter 100, such as that shown in FIG. 1, is well known and understood in the prior art and thus not explained in detail here. A drawback of polyphase filter 100 is: an amplitude of B1 is smaller than an amplitude of A1 due to a loss caused by the first high-pass filter made up of capacitor 111 and resistor 124. An amplitude of B2 is smaller than the amplitude of A1 due to the first low-pass filter made up of resistor 121 and capacitor 112. Likewise, an amplitude of B3 is smaller than an amplitude of A2, and an amplitude of B4 is smaller the amplitude of A2. Smaller amplitudes, as those identified above, lead to a loss in signal-to-noise ratio.

In U.S. Pat. No. 10,469,061, Lin discloses a quadrature clock generator that can generate a quadrature clock from a two-phase clock without using filters that attenuate the two-phase clock and inevitably degrade a signal-to-noise ratio. However, the quadrature clock generator disclosed therein does not guarantee an accurate relative timing among the four phases of the quadrature clock, i.e., it does not guarantee the four phases are accurately spaced in time.

What is desired is a quadrature clock generator that can guarantee that the four phases of the quadrature clock are accurately spaced in time.

SUMMARY OF THE DISCLOSURE

In an embodiment, a quadrature clock generator comprises: a variable delay clock generator configured to receive a first clock and a third clock and output a second clock and a fourth clock in accordance with a control signal, wherein the first clock and the third clock are of the same period and substantially the same waveform but offset in timing by one half of the period; a quadrature phase error detector configured to receive the first clock, the second clock, the third clock, and the fourth clock and output a first phase detection signal and a second phase detection signal, wherein the first phase detection signal represents a relative timing between the first clock and the second clock and the second phase detection signal represents a relative timing between the second clock and the third clock; and an amplifier configured to amplify a difference between the first phase detection signal and the second phase detection signal into the control signal.

In an embodiment, a method of generating a quadrature clock comprises: receiving a first clock and a third clock, wherein the first clock and the third clock are of the same period and substantially the same waveform but offset in timing by one half of the period; generating a second clock and a fourth clock from the first clock and the third clock in accordance with a control signal using a variable delay clock generator; generating a first phase detection signal and a second phase detection signal by detecting a relative timing between the first clock and the second clock and a relative timing between the second clock and the third clock, respectively, using a quadrature phase error detector; and amplifying a difference between the first phase detection signal and the second phase detection signal into the control signal.

DETAILED DESCRIPTION OF THIS DISCLOSURE

The present disclosure is directed to quadrature clock generation. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "signal," "clock," "phase," "period," "inverter," "transmission gate," "NAND gate," "XOR gate," "logic gate," "logical signal," "two-phase clock," "four-phase clock," "resistor," "capacitor," "varactor," "low-pass filter," "amplifier," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skill in the art can read schematics of a circuit comprising components such as NAND gate and inverter and do not need a verbose description about how one component connects with another in the schematics.

A circuit is a collection of a transistor, a capacitor, a resistor, and/or other electronic devices inter-connected in a certain manner to embody a certain function.

A signal is a voltage of a variable level that carries a certain information and can vary with time. A level of the signal at a moment represents a state of the signal at that moment. A composite signal comprises a plurality of voltages, each of which is of a variable level that carries a certain information and can vary with time. In this disclosure, a composite signal is sometimes simply referred to as a signal when the type of signal is clear from the context.

A logical signal is a voltage signal of two states: a low state and a high state. The low state is also known as a "0" state, while the high stage is also known as a "1" state. Regarding a logical signal Q, stating that "Q is high" or "Q is low," means that "Q is in the high state" or "Q is in the low state." Likewise, stating that "Q is 1" or "Q is 0," means that "Q is in the 1 state" or "Q is in the 0 state."

Upon a low-to-high transition of a logical signal, a rising edge occurs; upon a high-to-low transition of a logical signal, a falling edge occurs.

A first logical signal is said to be a logical inversion of a second logical signal if the first logical signal and the second logical signal always have opposite states. That is, when the first logical signal is 1, the second logical signal will be 0; when the first logical signal is 0, the second logical signal will be 1. When a first logical signal is a logical inversion of a second logical signal, the first logical signal is said to be complementary to the second logical signal.

A clock is a logical signal that periodically toggles back and forth between a low state and a high state. A timing difference between a rising edge and a subsequent rising edge of a clock determines a period of the clock. A timing of a clock is often measured using "degree" as unit, wherein a period of the clock is equal to 360 degrees, a half period of the clock is equal to 180 degrees, and a quarter period of the clock is equal to 90 degrees. A multi-phase clock is a composite signal and a collection of a plurality of clocks of the same period and substantially the same waveform yet different timings. Each clock of said plurality of clocks of said multi-phase clock is said to be a phase of the multi-phase clock. A two-phase clock comprises a first phase, say a 0-degree phase, and a second phase, say a 180-degree phase, wherein the first phase and the second phase are substantially the same except for a timing difference that is equal to 180 degrees, i.e., one half of the period of the two-phase clock. A quadrature clock is a four-phase clock comprising a first phase, say a 0-degree phase, a second phase, say a 90-degree phase, a third phase, say a 180-degree phase, and a fourth phase, say a 270-degree phase, wherein a timing difference between a rising edge of the first (second, third, fourth) phase and a subsequent rising edge of the second (third, fourth, first) phase is equal to 90 degrees, i.e., one quarter of the period of the quadrature clock.

In a context of this present disclosure, a variable delay circuit is a circuit that receives an input clock and outputs an output clock such that the output clock is of substantially the same waveform as the input clock but having a timing delay that is variable and controlled by a control signal.

Figure 2:
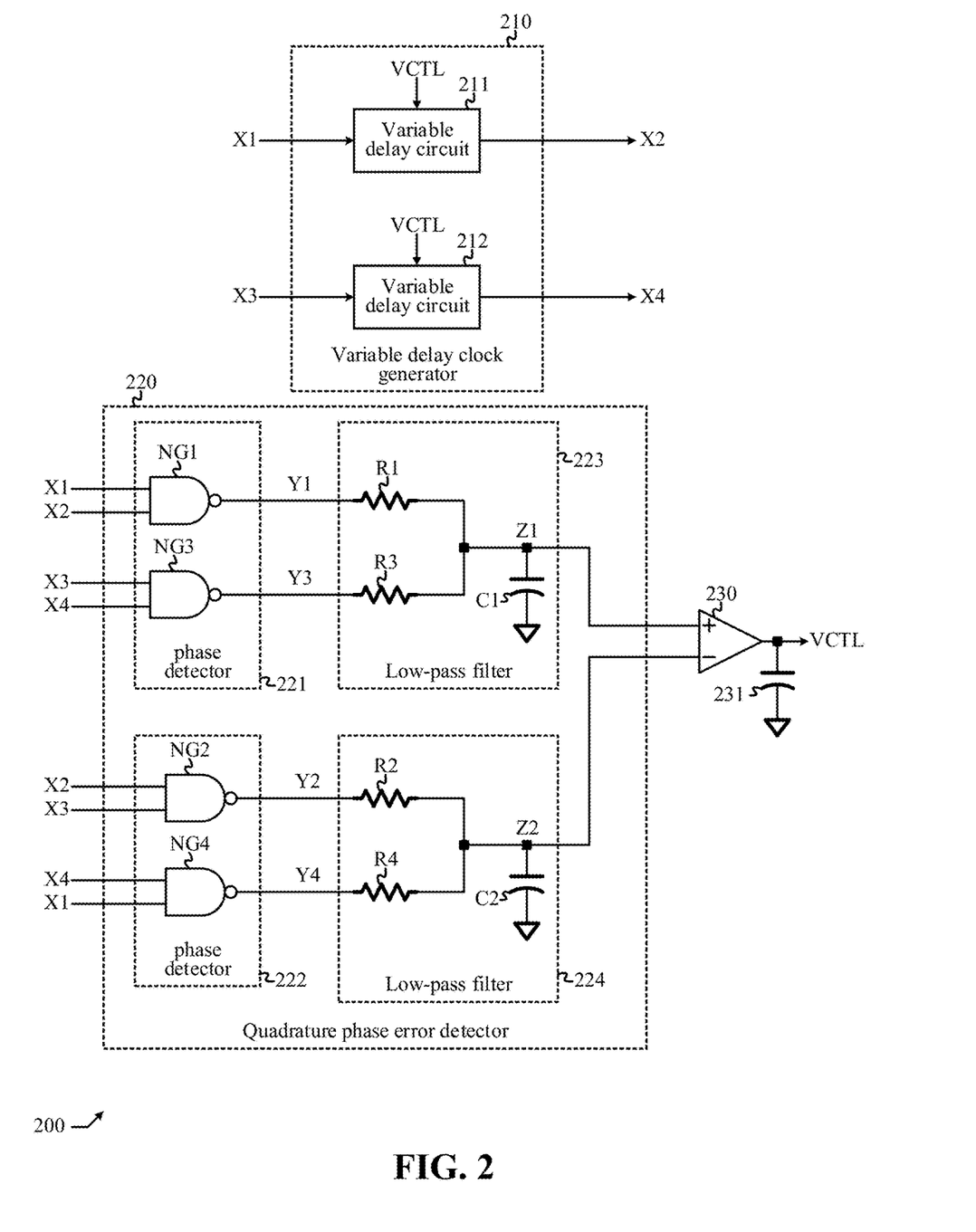
FIG. 2 shows a schematic diagram of a quadrature clock generator in accordance with an embodiment of the present disclosure.

A schematic diagram of a quadrature clock generator 200 in accordance with an embodiment of the present disclosure is depicted in FIG. 2. Quadrature clock generator 200 receives a two-phase clock comprising a 0-degree phase clock X1 and a 180-degree phase clock X3 and generates a 90-degree phase clock X2 and a 270-degree phase clock X4, so that the clocks X1, X2, X3, and X4 (hereinafter refer to as X1, X2, X3, and X4) form a four-phase clock. Quadrature clock generator 200 comprises: a variable delay clock generator 210 configured to receive X1 and X3 and output X2 and X4 in accordance with a control signal VCTL; a quadrature phase error detector 220 configured to receive X1, X2, X3, and X4 and output an error signal jointly embodied by a first phase detection signal Z1 and a second phase detection signal Z2; an amplifier 230 configured to receive phase detection signals Z1 and Z2 (hereinafter refer to as Z1, Z2) and output the control signal VCTL; and a capacitor 231 configured to hold a value of the control signal VCTL (hereinafter refer to as VCTL).

Figure 3:
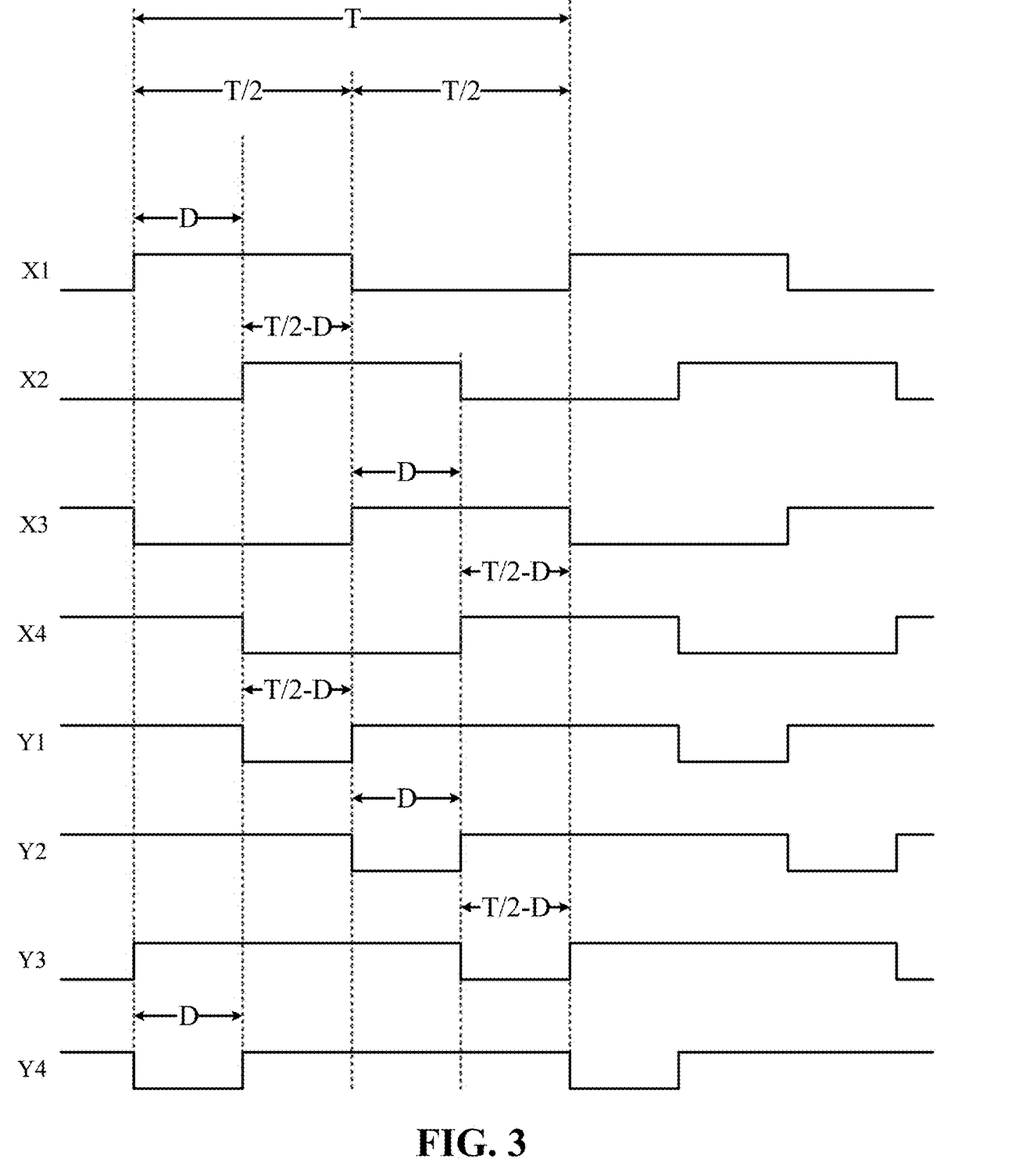
FIG. 3 shows a timing diagram of the quadrature clock generator of FIG. 2.

An exemplary timing diagram of quadrature clock generator 200 is shown in FIG. 3. As shown, a period of X1 is T, so is a period of X3. A timing difference between X1 and X3 is T/2; therefore, X1 and X3 can jointly form a two-phase clock. A timing difference between X1 and X2 is D, so is a timing difference between X3 and X4. When D is equal to T/4, a timing difference between X1 (X2, X3, X4) and X2 (X3, X4, X1) is equal to T/4, and X1, X2, X3, and X4 can jointly form an accurate four-phase clock. A purpose of quadrature clock generator 200 is to ensure that D is equal to T/4, thus allowing X1, X2, X3, and X4 to form an accurate four-phase clock.

Variable delay clock generator 210 comprises a first variable delay circuit 211 and a second variable delay circuit 212 configured to receive X1 and X3 and output X2 and X4, respectively, in accordance with a control by VCTL; X2 (X4) is substantially the same as X1 (X3) except for a delay of an amount D controlled by VCTL. When VCTL is set to an optimal value, D is equal to T/4. When VCTL deviates from the optimal value, D will be either greater than or smaller than T/4. In an embodiment, D decreases (increases) when a value of VCTL increases (decreases).

Quadrature phase error detector 220 comprises: a first phase detector 221 configured to receive the four-phase clock (comprising X1, X2, X3, and X4) and outputs two logical signals Y1 and Y3 that represents a first relative phase among the four phases (X1, X2, X3, and X4) of the four-phase clock; a second phase detector 222 configured to receive the four-phase clock (comprising X1, X2, X3, and X4) and outputs another two logical signals Y2 and Y4 that represents a second relative phase among the four phases (X1, X2, X3, and X4) of the four-phase clock; a first low-pass filter 223 comprising two resistors R1 and R3 and a capacitor C1 configured to receive Y1 and Y3 and output Z1; and a second low-pass filter 224 comprising another two resistors R2 and R4 and an another capacitor C2 configured to receive Y2 and Y4 and output Z2. The first phase detector 221 comprises two NAND gates NG1 and NG3, wherein NG1 receives X1 and X2 and outputs Y1, and NG3 receives X3 and X4 and output Y3. The second phase detector 222 comprises another two NAND gates NG2 and NG4, wherein NG2 receives X2 and X3 and outputs Y2, and NG4 receives X4 and X1 and output Y4. As shown in FIG. 3, Y1 is low only when X1 and X2 are both high, which occurs for a duration of T/2−D for every clock cycle. Likewise, Y3 is low only when X3 and X4 are both high, which also occurs for a duration of T/2−D for every clock cycle.

On the other hand, Y2 is low only when X2 and X3 are both high, which occurs for a duration of D for every clock cycle. Likewise, Y4 is low only when X4 and X1 are both high, which also occurs for a duration of D for every clock cycle. The first low-pass filter 223 performs a low-pass filtering function on Y1 and Y3, so that Z1 represents an average value of Y1 and Y3 and consequently represents an inversion of a value of T/2−D since Y1 and Y3 are low for a duration of T/2−D for every clock cycle. The second low-pass filter 224 performs a low-pass filtering function on Y2 and Y4, so that Z2 represents an average value of Y2 and Y4 and consequently an inversion of a value of D since Y2 and Y4 are low for a duration of D for every clock cycle. When D is equal to T/4, Z1 and Z2 will be equal; when D is greater (smaller) than T/4, Z1 will be greater (smaller) than Z2, and it indicates X2 and X4 need to be delayed more from X1 and X3, respectively. Amplifier 230 amplifies a difference between Z1 and Z2 into VCTL. When D is greater (smaller) than T/4, a value of Z1 minus Z2 will be positive (negative), causing VCTL to rise (fall), resulting into a decrease (increase) of D by the variable delay clock generator 210. A negative feedback control loop is thus formed. This way, D is controlled in a closed-loop manner to be equal to T/4, so that Z1 is equal to Z2 and VCTL stays at an optimal value held by capacitor 231. In other words, a timing of X2 and X4 relative to X1 and X3 are calibrated. Since this closed-loop control takes place automatically, quadrature clock generator 200 is said to be self-calibrating.

Figure 4:
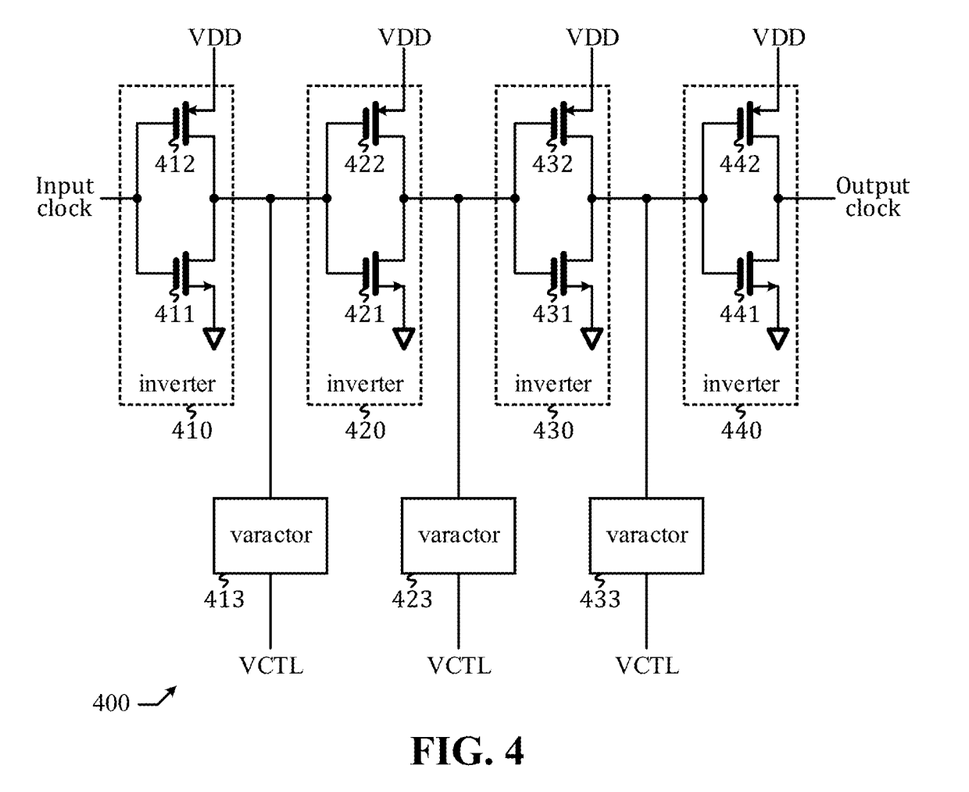
FIG. 4 shows a schematic diagram of a variable delay circuit.

A schematic diagram of a variable delay circuit 400 that can be instantiated to embody variable delay circuits 211 and 212 is depicted in FIG. 4. Variable delay circuit 400 receives an input clock, which is X1 (X3) when variable delay circuit 400 is instantiated to embody variable delay circuit 211 (212), and outputs an output clock, which is X2 (X4) when variable delay circuit 400 is instantiated to embody variable delay circuit 211 (212). Variable delay circuit 400 comprises a plurality of inverters configured in a cascade topology, wherein each of said plurality of inverters comprises a NMOS transistor and a PMOS transistor, and a plurality of inter-inverter shunt varactors controlled by VCTL. By way of example but not limitation, four inverters 410, 420, 430, and 440, and three inter-inverter shunt varactors 413, 423, and 433 are shown; inverter 410 (420, 430, 440) comprises NMOS transistor 411 (421, 431, 441) and PMOS transistor 412 (422, 432, 442). Here, "VDD" denotes a power supply node. VCTL is a common bias voltage for the three inter-inverter shunt varactors 413, 423, and 433, which have a variable capacitance controlled by a value (i.e., voltage level) of VCTL: a higher value of VCTL leads to a smaller capacitance.

A delay of inverter 410 (420, 430) is determined by a capacitance of shunt varactor 413 (423, 433): a smaller capacitance of shunt varactor 413 (423, 433) leads to a smaller delay. Therefore, the output clock is substantially the same as the input clock except for a delay of an amount controlled by VCTL, wherein a higher value of VCTL leads to a smaller amount of delay; this is clear to those of ordinary skill in the art and thus no detailed explanation is needed.

Amplifier 230 can be embodied by whatever amplifier circuit known in the prior art at a discretion of a circuit designer. Capacitor 231 can be either an explicit capacitor or a parasitic capacitor of amplifier 230. A concept of "parasitic capacitor" is well known to those of ordinary skill in the art and thus not described in detail here.

Note that Y1 and Y3 are the same signal, as far as an average value is concerned. Likewise, Y2 and Y4 are the same signal, as far as an average value is concerned. Therefore, a function of quadrature phase error detector 220 still holds if NG3, NG4, R3, and R4 were removed. Likewise, a function of quadrature phase error detector 220 still holds if NG1, NG2, R1, and R2 were removed.

Using a NAND gate (such as NG1, NG2, NG3, and NG4) to embody a phase detector is just an example but not limitation. Other phase detector circuits may be used. For instance, a XOR (exclusive-OR) gate can also embody a phase detector function. Both NAND gate and XOR gate are a logic gate.

Figure 5:
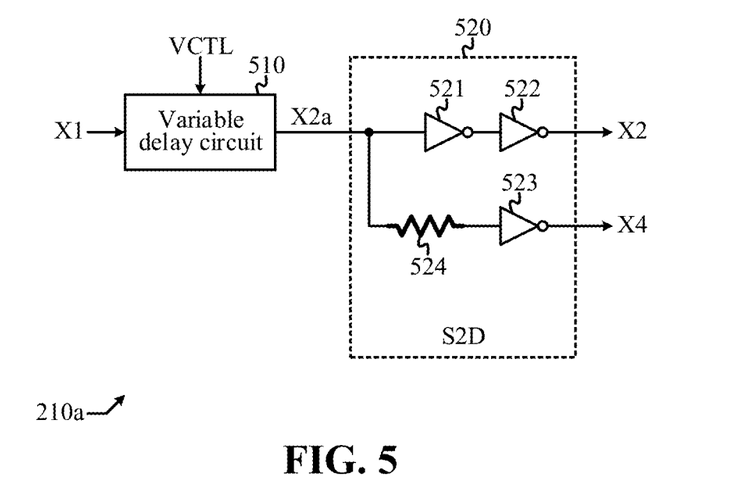
FIG. 5 shows a schematic diagram of an alternative variable delay clock generator.

In FIG. 2, variable delay clock generator 210 comprises two variable delay circuits 211 and 212 configured to receive X1 and X3 and output X2 and X4, respectively. In an alternative embodiment, variable delay clock generator 210 is replaced by an alternative variable delay clock generator 210a, a schematic diagram of which is depicted in FIG. 5. As shown, the alternative variable delay clock generator 210a comprises a variable delay circuit 510 configured to receive X1 and output an interim clock X2a in accordance with VCTL and a S2D (which stands for single-ended-to-differential converter) 520 configured to receive X2a and output X2 and X4. Variable delay circuit 510 can be embodied by instantiating variable delay circuit 400 of FIG. 4. S2D 520 comprises three inverters 521, 522, and 523 and one resistor 524. Inverters 521 and 522 are cascaded to receive X2a and output X2, such that X2 is substantially the same as X2a except for a delay caused by inverters 521 and 522. Resistor 524 and inverter 523 are cascaded to receive X2a and output X4 so that X4 is an inversion of X2a with a delay caused by resistor 524 and inverter 523. When a value of resistor 524 is properly chosen, a delay caused by resistor 524 and inverter 523 can be approximately equal to a delay caused by inverters 521 and 522; this way, X4 is substantially a logical inversion of X2, and thus X2 and X4 are 180 degrees out of phase. The alternative variable delay clock generator 210a could be more efficient than the variable delay clock generator 210 shown in FIG. 2 since only one variable delay circuit is used. In addition, the alternative variable delay clock generator 210a only needs X1 and does not need X3. In an embodiment, resistor 524 is embodied by a transmission gate, which is well known by those of ordinary skill in the art and thus not explained in detail here.

Figure 6:
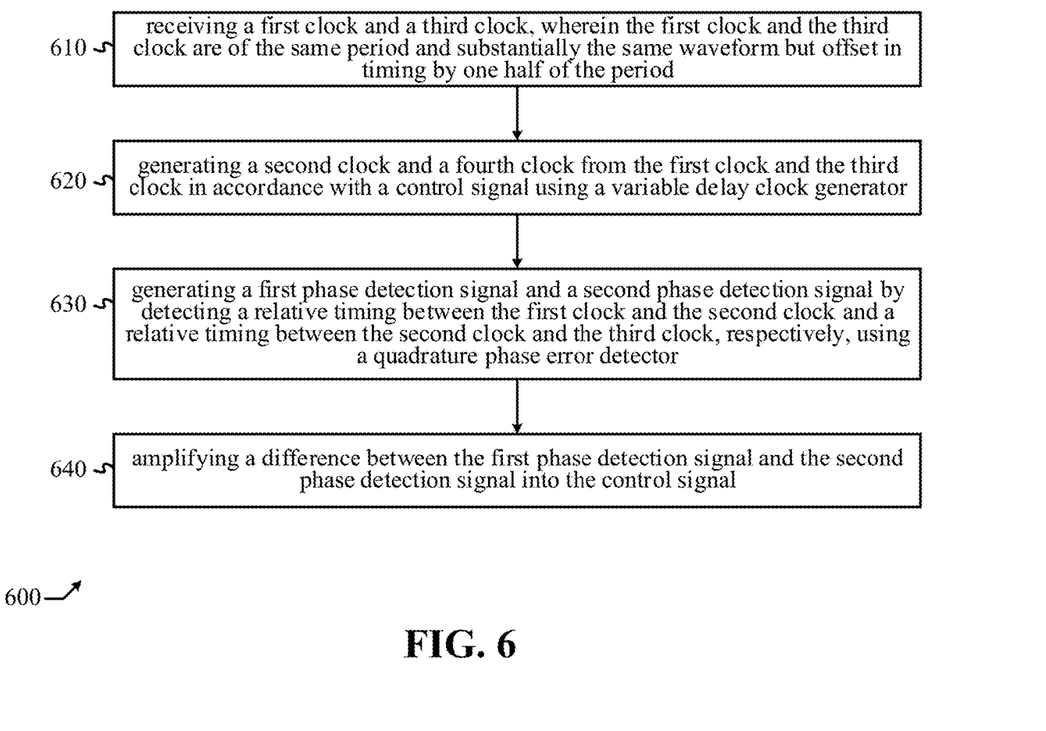
FIG. 6 shows a flow diagram of a method of generating a quadrature clock in accordance with an embodiment of the present disclosure.

As illustrated by a flow diagram 600 shown in FIG. 6, a method of generating a quadrature clock in accordance with an embodiment of the present disclosure comprises: (step 610) receiving a first clock and a third clock, wherein the first clock and the third clock are of the same period and substantially the same waveform but offset in timing by one half of the period; (step 620) generating a second clock and a fourth clock from the first clock and the third clock in accordance with a control signal using a variable delay clock generator; (step 630) generating a first phase detection signal and a second phase detection signal by detecting a relative timing between the first clock and the second clock and a relative timing between the second clock and the third clock, respectively, using a quadrature phase error detector; and (step 640) amplifying a difference between the first phase detection signal and the second phase detection signal into the control signal.

Those skilled in the art will readily observe that numerous modifications and alterations of the device and method may be made while retaining the teachings of the disclosure.

Accordingly, the above disclosure should not be construed as limited only by the metes and bounds of the appended claims.

What is claimed is:

1. A quadrature clock generator comprising:
a variable delay clock generator configured to receive a first clock and a third clock and output a second clock and a fourth clock in accordance with a control signal, wherein the first clock and the third clock are of the same period and substantially the same waveform but offset in timing by one half of the period;
a quadrature phase error detector configured to receive the first clock, the second clock, the third clock, and the fourth clock and output a first phase detection signal and a second phase detection signal, wherein the first phase detection signal represents a relative timing between the first clock and the second clock and the second phase detection signal represents a relative timing between the second clock and the third clock; and
an amplifier configured to amplify a difference between the first phase detection signal and the second phase detection signal into the control signal.

2. The quadrature clock generator of claim 1, wherein the variable delay clock generator comprises a first variable delay circuit configured to receive the first clock and output the second clock with a delay controlled by the control signal and a second variable delay circuit configured to receive the third clock and output the fourth clock with a delay controlled by the control signal.

3. The quadrature clock generator of claim 1, wherein the variable delay clock generator comprises a variable delay circuit configured to receive the first clock and output an interim clock with a delay controlled by the control signal, and a single-ended-to-differential converter configured to receive the interim clock and output the second clock and the fourth clock.

4. The quadrature clock generator of claim 1, wherein the quadrature phase detector comprises: a first phase detector comprising a first logic gate and configured to receive the first clock and the second clock and output a first logical signal; a first low-pass filter configured to filter the first logical signal into the first phase detection signal; a second phase detector comprising a second logic gate and configured to receive the second clock and the third clock and output a second logical signal; and a second low-pass filter configured to filter the second logical signal into the second phase detection signal.

5. The quadrature clock generator of claim 4, wherein both the first logic gate and the second logical gate are NAND gates.

6. The quadrature clock generator of claim 4, wherein both the first logic gate and the second logic gate are XOR gates.

7. The quadrature clock generator of claim 4, wherein the first phase detector further comprises a third logic gate configured to receive the third clock and the fourth clock and output a third logical signal, which along with the first logical signal are filtered by the first low-pass filter into the first phase detection signal; the second phase detector further comprises a fourth logic gate configured to receive the fourth clock and the first clock and output a fourth logical signal, which along with the second logical signal are filtered by the second low-pass filter into the second phase detection signal.

8. The quadrature clock generator of claim 7, wherein all the first logic gate, the second logic gate, the third logic gate, and the fourth logic gate are NAND gates.

9. The quadrature clock generator of claim 7, wherein all the first logic gate, the second logic gate, the third logic gate, and the fourth logic gate are XOR gates.

10. The quadrature clock generator of claim 1 further comprises a capacitor configured to hold a value of the control signal.

11. A method of quadrature clock generation comprising:
receiving a first clock and a third clock, wherein the first clock and the third clock are of the same period and substantially the same waveform but offset in timing by one half of the period;
generating a second clock and a fourth clock from the first clock and the third clock in accordance with a control signal using a variable delay clock generator;
generating a first phase detection signal and a second phase detection signal by detecting a relative timing between the first clock and the second clock and a relative timing between the second clock and the third clock, respectively, using a quadrature phase error detector; and
amplifying a difference between the first phase detection signal and the second phase detection signal into the control signal.

12. The method of quadrature clock generation of claim 11, wherein the variable delay clock generator comprises a first variable delay circuit configured to receive the first clock and output the second clock with a delay controlled by the control signal and a second variable delay circuit configured to receive the third clock and output the fourth clock with a delay controlled by the control signal.

13. The method of quadrature clock generation of claim 11, wherein the variable delay clock generator comprises a variable delay circuit configured to receive the first clock and output an interim clock with a delay controlled by the control signal, and a single-ended-to-differential converter configured to receive the interim clock and output the second clock and the fourth clock.

14. The method of quadrature clock generation of claim 11, wherein the quadrature phase detector comprises: a first phase detector comprising a first logic gate and configured to receive the first clock and the second clock and output a first logical signal; a first low-pass filter configured to filter the first logical signal into the first phase detection signal; a second phase detector comprising a second logic gate and configured to receive the second clock and the third clock and output a second logical signal; and a second low-pass filter configured to filter the second logical signal into the second phase detection signal.

15. The method of quadrature clock generation of claim 14, wherein both the first logic gate and the second logical gate are NAND gates.

16. The method of quadrature clock generation of claim 14, wherein both the first logic gate and the second logic gate are XOR gates.

17. The method of quadrature clock generation of claim 14, wherein the first phase detector further comprises a third logic gate configured to receive the third clock and the fourth clock and output a third logical signal, which along with the first logical signal are filtered by the first low-pass filter into the first phase detection signal; the second phase detector further comprises a fourth logic gate configured to receive the fourth clock and the first clock and output a fourth logical signal, which along with the second logical signal are filtered by the second low-pass filter into the second phase detection signal.

18. The method of quadrature clock generation of claim 17, wherein all the first logic gate, the second logic gate, the third logic gate, and the fourth logic gate are NAND gates.

19. The method of quadrature clock generation of claim 17, wherein all the first logic gate, the second logic gate, the third logic gate, and the fourth logic gate are XOR gates.

20. The method of quadrature clock generation of claim 11 further comprises using a capacitor to hold a value of the control signal.

* * * * *